United States Patent
Le

[11] Patent Number: 6,160,309
[45] Date of Patent: Dec. 12, 2000

[54] PRESS-FIT SEMICONDUCTOR PACKAGE

[76] Inventor: Hiep Le, 1143 E. Cottonwood La., Phoenix, Ariz. 85048

[21] Appl. No.: 09/276,779

[22] Filed: Mar. 25, 1999

[51] Int. Cl.⁷ .............................. H01L 23/06; H01L 23/48
[52] U.S. Cl. ......................... 257/684; 257/687; 257/688; 257/689; 257/694; 257/731
[58] Field of Search ................................... 257/687, 694, 257/727, 731, 793, 688, 658, 684, 689; 438/117, 120

[56] References Cited

U.S. PATENT DOCUMENTS

| | | | |
|---|---|---|---|
| 3,717,523 | 2/1973 | Dunsche | 257/727 |
| 3,743,896 | 7/1973 | Weike et al. | 257/727 |
| 4,303,935 | 12/1981 | Ragaly | 257/694 |
| 4,498,096 | 2/1985 | Addie et al. | 257/694 |
| 4,532,539 | 7/1985 | Frister | 257/694 |
| 5,005,069 | 4/1991 | Wasmer et al. | 257/684 |
| 5,206,793 | 4/1993 | Boudrant et al. | 257/689 |
| 5,302,856 | 4/1994 | Narita et al. | 257/788 |
| 5,424,594 | 6/1995 | Saito et al. | 310/680 D |
| 5,886,403 | 3/1999 | Yoshinaga et al. | 257/688 |

FOREIGN PATENT DOCUMENTS

| | | |
|---|---|---|
| 1-157252 | 6/1989 | Japan . |
| 2-126664 | 5/1990 | Japan . |
| 4-103780 | 8/1992 | Japan . |

Primary Examiner—Olik Chaudhuri
Assistant Examiner—Alonzo Chambliss
Attorney, Agent, or Firm—Snell & Wilmer L.L.P.

[57] ABSTRACT

A press-fit package, such as a press-fit rectifier, includes an improved cup design which incorporates a mold lock formed within the inner wall of the cavity. a well is provided between the inner cavity wall and the die bond area to assist in mechanical decoupling of the press-fit force and the semiconductor die. An insert profile is formed along the outer surface of the cup to assist in proper alignment of the press-fit package during assembly, and a small lip is formed around the perimeter of the die bond area.

4 Claims, 5 Drawing Sheets

PRESS-FIT SEMICONDUCTOR PACKAGE

CROSS-REFERENCE TO RELATED APPLICATIONS

Not applicable.

FEDERALLY SPONSORED RESEARCH OR DEVELOPMENT

Not applicable.

BACKGROUND OF THE INVENTION

1. Technical Field

The present invention relates, generally, to semiconductor packaging and, more particularly, to a press-fit rectifier package employing an improved cup design.

2. Background Information

The need for high-volume assembly of components employing power semiconductor devices, along with the continued need for optimum heat-transfer capabilities for such devices, has led to the development of "press-fit" packages. These packages, most often used for high power rectifier applications, have enjoyed increasing popularity—particularly in the automotive industry, where power rectifiers are often used in multiples of 6 or 8 in alternator designs and the like.

Examples of press-fit and comparable package designs can be found in U.S. Pat. No. 5,005,069, issued Apr. 2, 1991 to Wasmer et al. Referring to the prior art package shown in FIG. 1, a typical prior art package includes a nailhead 104 and cup 114 having a semiconductor die 111 bonded therebetween. The perimeter of die 111 is typically coated with a passivant 110. A mold lock 106 is provided along the bottom of the cup, and a cavity formed by wall 108 is filled with an encapsulant 107.

As illustrated, the press-fit package 102 is inserted into an opening formed within a plate or other form 104 via an applied axial force 120. A compression fit between the inner surface of opening and the outer surface of the cup 114 is formed. As a result, no solder or other bonding agent is needed to provide electrical and mechanical contact between the press-fit package 102 and plate 104.

Currently known press-fit packages such as this are, however, inadequate in a number of respects. For example, known packages are commonly susceptible to die cracking during the press-in operation. That is, die 111 is not sufficiently decoupled mechanically from the package body. Thus, the applied radial compressive force (112) results in high localized tensile stress at one or more locations (typically the corners) of die 111. This can lead to catastrophic die fracture or, in some instances, small scale cracking which propagates during subsequent operation.

Known press-fit packages are also inadequate in that they tend to become misaligned during the press-in operation. More specifically, as it is common for the packages to be dropped into place prior to application of the press-in force, it is possible for the packages to be tilted at an angle, thereby increasing the applied stress experienced by the package during press-in and resulting in a non-optimal contact between the package and the plate. This inadequacy is a function of a number of attributes of the package, including, for example, weight, center of gravity, and exterior profile of the package.

In addition, known packages are often susceptible to thermo-mechanical fatigue during field operation. That is, small-scale contractions and expansions arising during heating and cooling cycles gives rise to high-cycle fatigue of the solder bonds used to attach the die to the nailhead and cup.

Furthermore, many packages, in attempt to address one or more of the aforementioned problems, employ plastic enclosures that are not amenable to high-temperature manufacturing and/or high temperature field operation.

Methods are therefore needed in order to overcome these and other limitations of the prior art. More particularly, there is a long-felt need for robust press-fit packages which eliminate press-in related die cracking, reduce misalignment, reduce failure due to fatigue, and can withstand high-temperature operation.

BRIEF SUMMARY OF THE INVENTION

The present invention provides systems and methods which overcome the shortcomings of the prior art. In accordance with one aspect of the present invention, a press-fit package—for example, a press-fit rectifier—employs an improved cup design which incorporates a mold lock formed within the inner wall of the cavity. In accordance with further aspects of the present invention, a well is provided between the inner cavity wall and the die bond area to assist in mechanical decoupling of the press-fit force and the semiconductor die. In accordance with yet another aspect of the present invention, an insert profile is formed along the outer surface of the cup to assist in proper alignment of the press-fit package during assembly. In accordance with yet another aspect of the present invention, a small lip is formed around the perimeter of the die bond area.

In this way, a press-fit package may be produced which greatly reduces die cracking and misalignment during press-in, and which is robust with respect to thermal fatigue and high temperature operation.

BRIEF DESCRIPTION OF THE SEVERAL VIEWS OF THE DRAWINGS

The subject invention will hereinafter be described in conjunction with the appended drawing figures, wherein like numerals denote like elements, and.

DETAILED DESCRIPTION OF PREFERRED EXEMPLARY EMBODIMENTS

Figure 1:
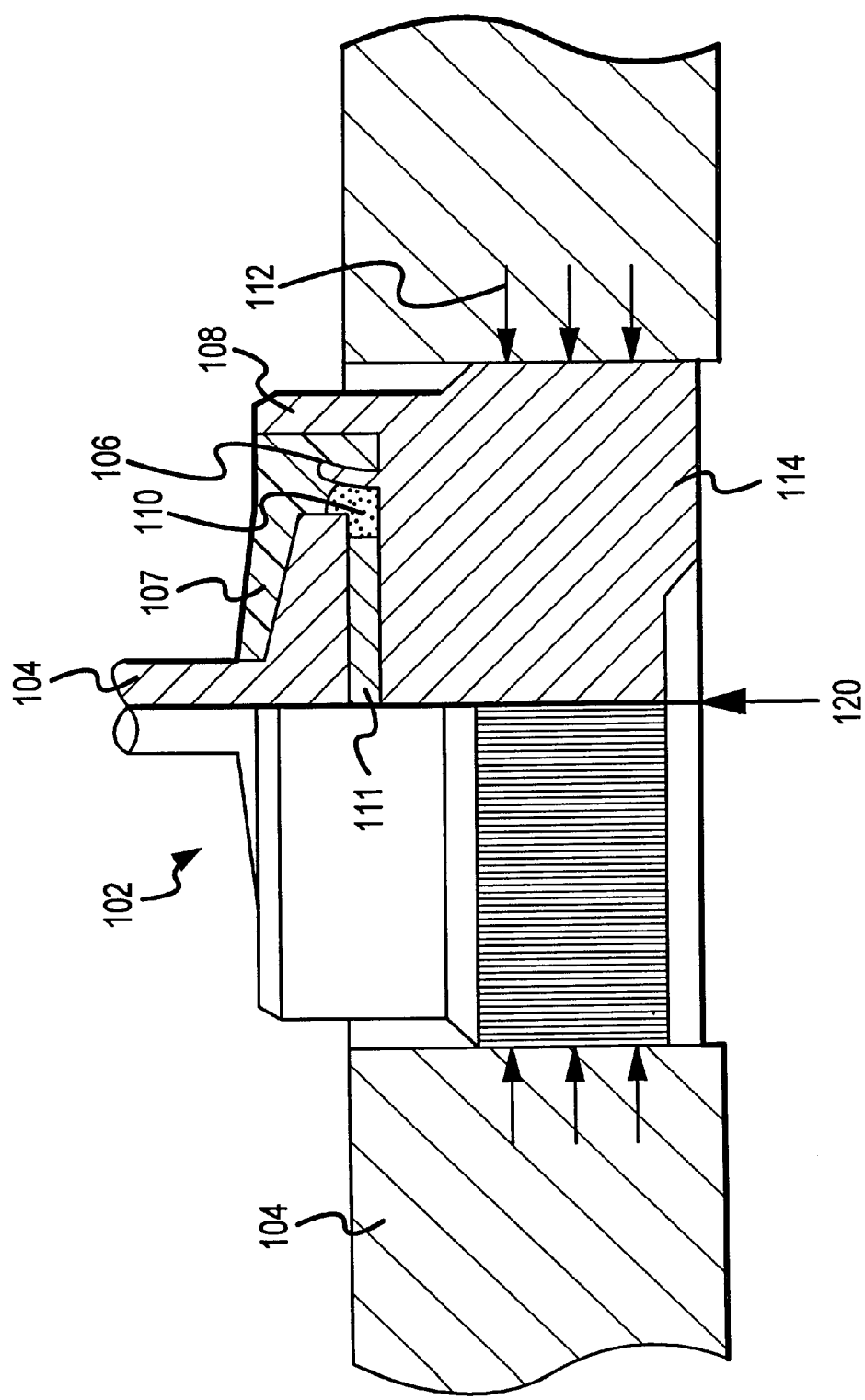
FIG. 1 is a partial cut-away view of a prior art press-fit package.
Figure 2:
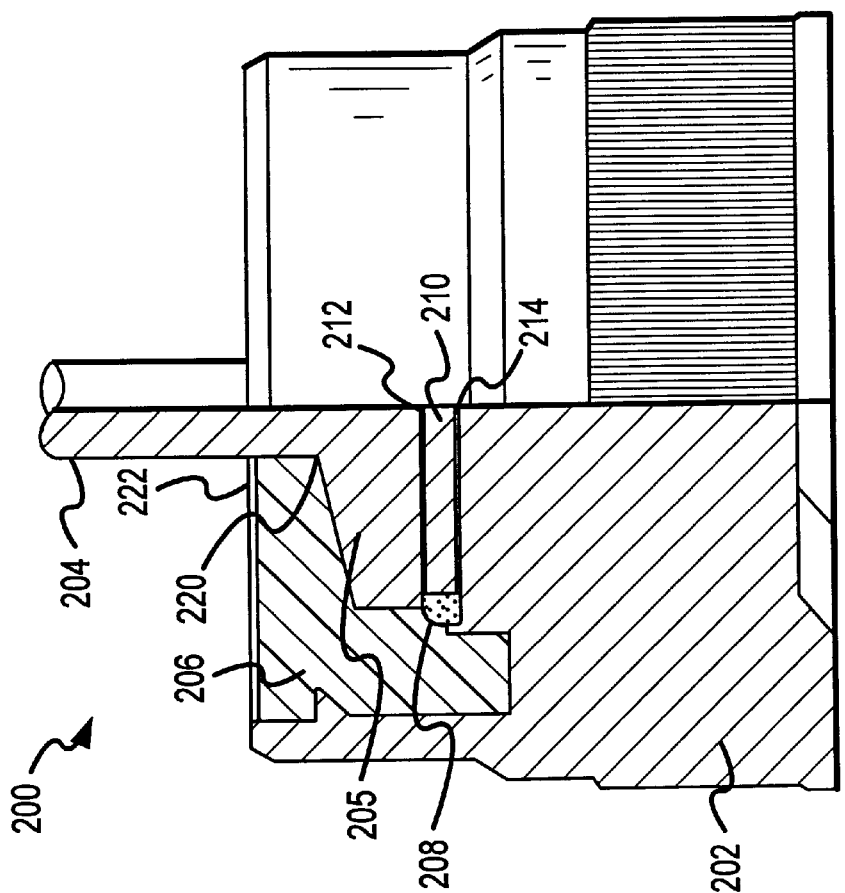
FIG. 2 is a partial cut-away overview of a press-fit package in accordance with various aspects of the present invention.

Systems and methods in accordance with various aspects of the present invention provide a press-fit package employing an improved cup design. Referring now to FIG. 2, an improved press-fit package in accordance with the present invention generally comprises an axial lead 204 with a nailhead 205, a cup 202, encapsulant 206, passivant 208, and a semiconductor die 210 having die bonds 212 and 214 for providing mechanical and electrical connectivity to nailhead 205 and cup 202 respectively. With momentary reference to FIG. 3, cup 202, which is described in further detail below, includes, inter alia, a mold lock 314 along a substantially cylindrical inner wall 312, a well 310, and a die bonding surface 308 surrounding by a lip 306.

As is known in the art, axial lead 204 and nailhead 205 are used to provide a conductive path to one side of semiconductor 320. For example, in the context of a silicon rectifier, axial lead 204 may correspond to the cathode or anode terminal of the device. Nailhead 205 may be formed in any convenient shape, for example, circular, hexagonal, rectangular, etc., depending upon the shape of die 210. In a preferred embodiment, nailhead 205 is substantially circular and is configured to form a slight overhang with respect to die 210 (e.g., about 30 microns).

Nailhead 205 and axial lead 204 may be integrally formed, having a neck 220, (as is typically the case) or may be two or more materials bonded together. In a preferred embodiment, nailhead 205 and axial lead 204 comprise high purity copper, for example, C-102 or C-101 copper. Those skilled in the art, however, will recognize that other suitable conductive materials may be employed.

Semiconductor die 210 comprises any suitable semiconductor device which may employed in a press-fit application. In a preferred embodiment, for example, die 210 comprises a P-N semiconductor diode having a cathode side and an anode side. For the purposes of this description, the term "rectifier" will be used interchangeably with the term "diode."

In the case where die 210 corresponds to a rectifier, the orientation of die 210 with respect to cup 202 and nailhead 205 may be selected in accordance with the desired package polarity. Furthermore, the rectifier may be planar (e.g., a diffused n-region within a p-substrate) or open-junction. In a preferred embodiment, die 210 comprises a rectangular or hexagonal die having an effective diameter or diagonal dimension of about 0.21 to 0.29 mils (thousands of an inch).

While die 210 is described above in the context of a silicon device, it will be appreciated that the present invention is not so limited, and that a variety of other semiconductor materials may be employed. Suitable materials include, for example, group IV semiconductors (i.e., Si, Ge, and SiGe), group III–V semiconductors (i.e., GaAs, InAs, and AlGaAs), and other less-conventional materials, such as SiC, diamond, and sapphire.

Die bonds 212 and 214 suitably comprise any convenient die bond material which provides electrical and mechanical connectivity from die 210 to nailhead 205 and cup 202. a variety of hard and soft solders may be used. In a preferred embodiment, die bonds 212 and 214 comprise a lead-based soft solder, for example, a 92.5/5/2.5 Pb—In—Ag solder having a melting point of about 315° C., with a thickness of about 1 mil.

Encapsulant 206 suitably comprises one or more insulating materials formed within cavity 303 of cup 202 after assembly of the internal components (i.e., nailhead 205, die 210, die bonds 212 and 214, and passivant 208), thereby providing structural support for the assembly and reducing the likelihood of contamination reaching the active regions of die 210. Encapsulant 206 may comprise any suitable insulating material, for example, an anhydride epoxy material such as any chosen from the Hysol FP 4410 family of epoxies.

Passivant 208 is employed to protect the exposed edges of die 210 from the effects of moisture, contamination, and the like. In a particularly preferred embodiment, where die 210 comprises an open-junction rectifier, passivant 208 is used to seal the exposed junction around the perimeter of the die. a number of commonly available passivants are suitable for this purpose, for example, silicone or polyimide. As will be discussed below in connection with cup 202, passivant 208 is preferably constrained by a lip (item 306 in FIG. 3) formed along the outer perimeter of the die bond area.

Figure 3:
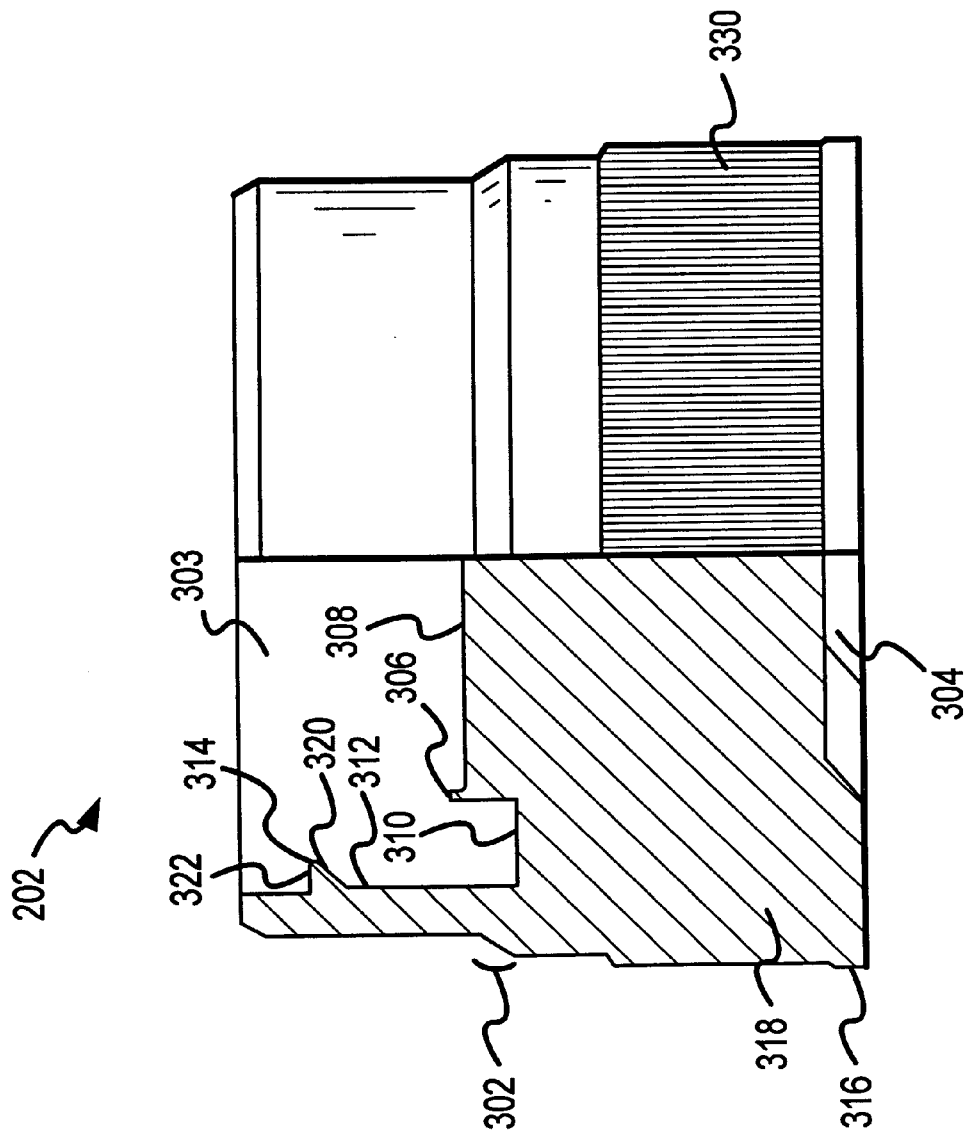
FIG. 3 is a partial cut-away view of a press-fit package cup in accordance with various aspects of the present invention.

Referring now to FIGS. 2 and 3, an exemplary cup 202 will now be described in detail. In general, cup 202 (prior to assembly of the finished package) comprises a heatsink region 318 and a cavity 303 open at top defined by an inner wall 312.

Inner wall 312 preferably includes an annular mold lock 314 which extends into cavity 303, thereby assisting in "locking" encapsulant 206 into place, and greatly improving the fatigue life of the part. Mold lock 314 may take a variety of shapes. In the illustrated embodiment, mold lock 314 forms a continuous ring. Alternatively, mold lock 314 may comprise a number of segments or arcs formed along inner wall 312.

The placement of 314 with respect to the depth of the cup (i.e., from the top of wall 312 to the die bond area 308) and the other features of press-fit package 200 may vary. In a preferred embodiment, mold lock 314 is located below the top of encapsulant 206 (222) and above the plane defined by die 210. In a particularly preferred embodiment, mold lock 314 is substantially aligned with the point along axial lead 204 where it flattens into nailhead 205 (i.e, at point 220).

Although mold lock 314 may take a variety of shapes, in a particularly preferred embodiment the lower surface 320 of mold lock 314 is substantially sloped (though not necessarily linear), and the top surface 322 is substantially flat, such that the resulting cross-section of mold lock 314 approximates a right triangle. The extent to which mold lock 314 extends outward from inner wall 312 may vary; however, in a preferred embodiment, mold lock 314 extends inward approximately a third the width of well 310.

The external surface of cup 202—more particularly, heatsink region 318—is preferably formed with a knurled region 330 that extends along at least a portion of the cup's height. These knurls assist in forming a compression fit between the exterior of the press-fit package and the opening (not shown) in which it will be placed. a plating material, for example, a layer of Sn plating about 1.0 to 2.0 mils thick is provided on the exterior of cup 202, as well as nailhead 205.

The underside of cup 302 preferably includes a dimple 304, for example, a conic frustrum cut-out formed within the center of heatsink 318. Dimple 304 serves at least two purposes. First, it helps relieve the radial component of stress experienced by the package as it is pressed into place. Second, and it can be used as a visual indicator of the power, current, voltage, or other indicia of the device's performance. For example, a device rated at higher current may include a dimple 304 with a substantially greater diameter than a device with a lower current rating.

The outer surface of cup 202 preferably includes an insert profile 302 to facilitate correct alignment of the device during press-in. That is, to the extent that high volume press-fit processes involve dropping or rough placement of the part into the opening, the beveled insert profile 302 assists in aligning the device such that it is pressed into place in a substantially coaxial fashion—i.e., so that it does not tilt significantly during placement. The shape and placement of alignment profile may be adjusted in accordance with, inter alia, the weight and shape of the device. In a preferred embodiment, a linear bevel is formed such that the top of the bevel is roughly aligned with the plane of die bond area 308, and the bottom of the bevel is roughly aligned with the plane of well 310. Those skilled in the art will recognize that other types of profiles and other placements for insert profile 302 may also be used.

Cup 202 may also incorporate a raised region 316 along the base of heat-sink 318 to provide a tight fit along the base of the cup during press-in. In a preferred embodiment, the height of region 316 is approximately equal to the depth of dimple 304.

Figure 4:
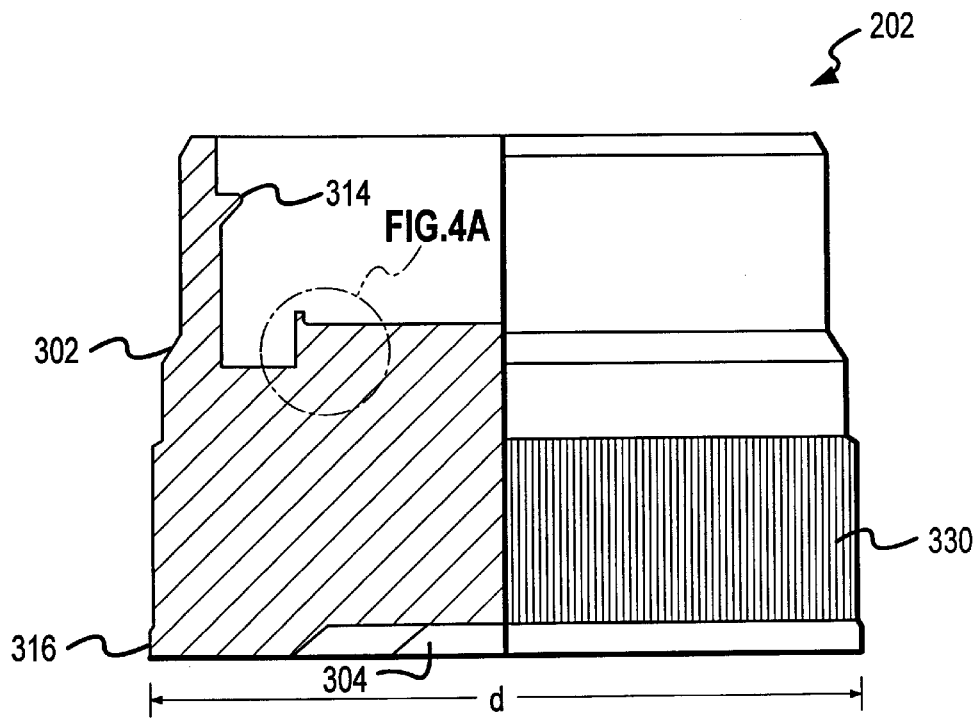
FIG. 4 is a partial cut-away view of a press-fit package cup in accordance with a particularly preferred embodiment of the present invention.
Figure 4A:
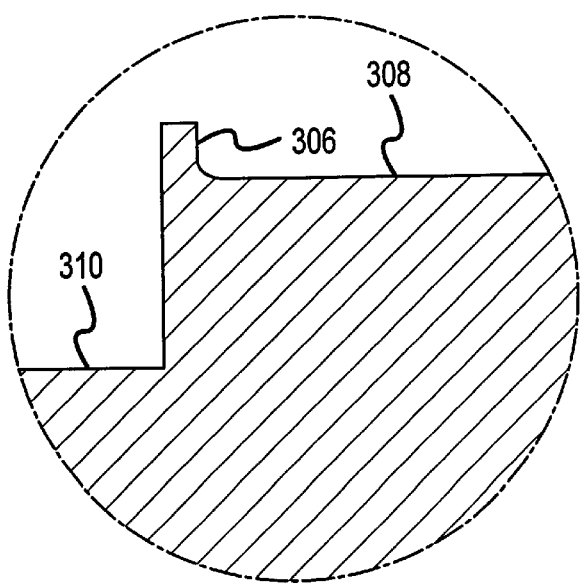
Figure 5:
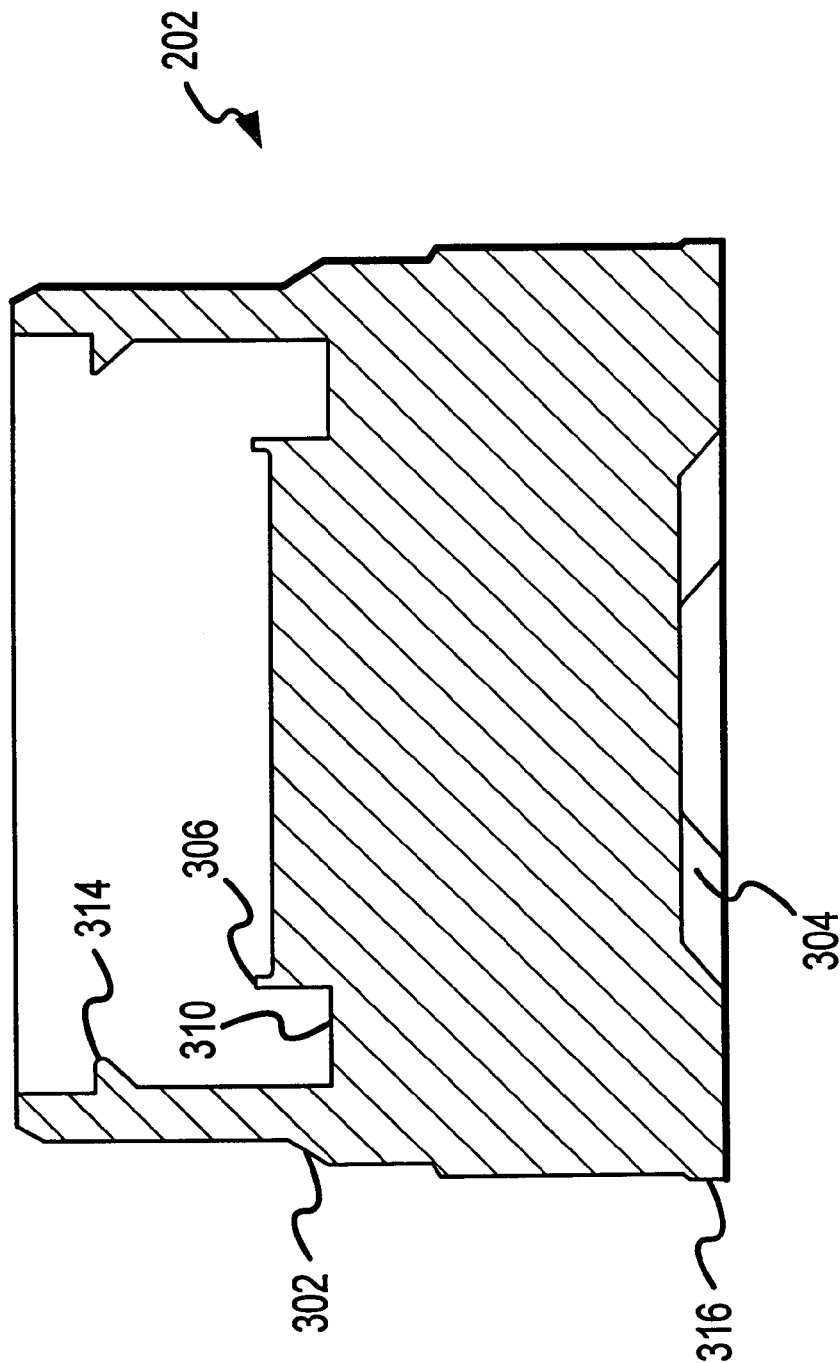
FIG. 5 is a partial cut-away view of a press-fit package cup in accordance with a particularly preferred embodiment of the present invention.

FIGS. 4 and 5 depict a particularly preferred embodiment of the present invention, wherein detailed dimensions (mm) are shown. Those skilled in the art will recognize that these embodiments are merely illustrative, and that the present invention is not so limited. Nevertheless, the illustrated ratio of dimensions are particularly advantageous. That is, given a cup diameter of d (referring now to FIG. 4), it is preferred that: the depth of the well 310 with respect to die bond area 308 be about 0.06 d; that the width of well 308 be about 0.1 d, that the diameter of the die bond area 308 be about 0.6 d; that the height of mold lock 314 with respect to well 310 be about 0.24 d; that the thickness of heatsink 318 (from the bottom of the cup to die bond area 308) be about 0.5d; that the total height of the cup be about 0.74 d; that insert profile 302 be centered at about 0.4 d above the bottom of the cup; that mold lock 314 is located about 0.077 d from the top of the cup and extends about 0.035 d from inner wall 312.

Having thus described the various components of an exemplary press-fit package 202, a preferred method of making an exemplary package will now be set forth in conjunction with FIGS. 2 and 3.

Initially, a cup 202 is manufactured using any suitable conventional coining and/or stamping techniques. For example, die bond area 308, lip 306, and well 310 may be stamped into the form, followed by formation of mold-lock 314 along inner wall 312. Other features such as region 316, insert profile 302, dimple 304, knurled region 330, can also be formed using any convenient technique.

Next, semiconductor die 210 is preferably soldered to die bond region 310. a variety of known solder processes may be employed for this purpose, including reflow of solder paste, solder preforms, or the like, in a controlled furnace. In a preferred embodiment, solder preforms comprising Pb/In/Ag soft solder are used.

Nailhead 205 is then preferably soldered to the top surface of die 210. This may be accomplished by inverting the nailhead/cup assembly during reflow to ensure proper placement of the components. After completion of the soldering steps, the edges of die 210 are preferably cleaned and/or etched. In the case where die 210 consists of an open-junction rectifier, a conventional plasma process, for example, within a $SF_6$—$N_2O$ atmosphere, is preferably employed. Alternatively, a wet chemical etch (e.g., KOH) may be used.

After a suitable drying step, the passivant 208 is applied to the outer edges of die 210. This may be done using a variety of conventional techniques, for example, the use of a Polyimide 30A dispensing too. It is desirable that the volume of material used is sufficient to completely cover the edges of die 210, but is not likely to cause spillage of material over the edge of lip 306. Such spillage can adversely affect adhesion of encapsulant 206 to the surface of well 310, resulting in increased susceptibility to moisture and contamination ingress. Passivant 208 is then suitably dried and/or cured as appropriate. In a preferred embodiment, passivant 208 is allowed to cure at about 250 degrees centigrade for about 330 minutes.

Next, the encapsulant material 206 is dispensed within cavity 303. This may be followed by a post-mold cure step depending upon the type of material used. In the illustrated embodiment, wherein a Hysol FP 4410 family epoxy is used, the encapsulant material 206 is deposited at a temperature of about 200 degrees centigrade.

In summary, a press-fit package has been provided which greatly reduces die cracking and misalignment during press-in, and which is robust with respect to thermal fatigue and high temperature operation.

Although the invention has been described herein in conjunction with the appended drawings, those skilled in the art will appreciate that the scope of the invention is not so limited. Modifications in the selection, design, and arrangement of the various components and steps discussed herein may be made without departing from the scope of the invention as set forth in the appended claims.

What is claimed is:

1. An improved press-fit package. said package comprising:
   a semiconductor device having a first side and a second side, said first side bonded to a nailhead, said second side bonded to a cup, said cup including:
      a heatsink having a well and a die-bond surface formed therein,
         wherein the plane of said die-bond surface is above said well;
      a lip around the perimeter of said die-bond surface;
      a substantially cylindrical inner wall bordering said well;
      an annular mold lock formed within said inner wall, wherein said
      mold lock is higher than said semiconductor die.

2. The package of claim 1, further comprising a insert profile formed on the exterior of said cup.

3. The package of claim 1, further comprising a dimple formed on the exterior of said cup.

4. The package of claim 1, further comprising a passivant surrounding said semiconductor device.

* * * * *